US008558508B2

(12) United States Patent  (10) Patent No.: US 8,558,508 B2
Fechalos et al.  (45) Date of Patent: Oct. 15, 2013

(54) BATTERY SYSTEM AND MANAGEMENT METHOD

(75) Inventors: William Fechalos, Naperville, IL (US); N. William Conrardy, Elmhurst, IL (US)

(73) Assignee: C & C Power, Inc., Carol Stream, IL (US)

( * ) Notice: Subject to any disclaimer, the term of this patent is extended or adjusted under 35 U.S.C. 154(b) by 1044 days.

(21) Appl. No.: 12/117,462

(22) Filed: May 8, 2008

(65) Prior Publication Data

US 2008/0303527 A1   Dec. 11, 2008

Related U.S. Application Data

(60) Provisional application No. 60/933,829, filed on Jun. 8, 2007.

(51) Int. Cl.
*H02J 7/00* (2006.01)

(52) U.S. Cl.
USPC ........... 320/132; 320/155; 320/157; 320/158; 320/159

(58) Field of Classification Search
USPC ......... 320/132, 155, 157–159, 134–136, 133; 324/425–434
See application file for complete search history.

(56) References Cited

U.S. PATENT DOCUMENTS

| 5,223,796 | A | * | 6/1993 | Waldman et al. | 324/687 |
| 5,281,955 | A | * | 1/1994 | Reich et al. | 340/636.12 |
| 5,592,067 | A | * | 1/1997 | Peter et al. | 320/103 |
| 5,703,465 | A | * | 12/1997 | Kinoshita et al. | 320/147 |
| 5,705,929 | A | * | 1/1998 | Caravello et al. | 324/430 |
| 6,268,710 | B1 | | 7/2001 | Koga | |
| 6,316,914 | B1 | * | 11/2001 | Bertness | 320/134 |
| 6,532,425 | B1 | * | 3/2003 | Boost et al. | 702/63 |
| 7,183,747 | B2 | * | 2/2007 | Kleineberg et al. | 320/132 |
| 7,474,228 | B2 | * | 1/2009 | Lockhart et al. | 340/636.1 |
| 2001/0033502 | A1 | * | 10/2001 | Blair et al. | 363/65 |
| 2002/0075941 | A1 | * | 6/2002 | Souissi et al. | 375/133 |
| 2002/0145405 | A1 | * | 10/2002 | Murakami et al. | 320/130 |
| 2003/0038612 | A1 | * | 2/2003 | Kutkut | 320/140 |
| 2006/0017444 | A1 | * | 1/2006 | Fechalos et al. | 324/433 |
| 2008/0218125 | A1 | * | 9/2008 | Bansal et al. | 320/132 |

OTHER PUBLICATIONS

Office Action dated Jun. 4, 2010 from the Canadian Intellectual Property Office for Canadian Patent Application No. 2,634,309, 3 pages.
The Nov. 12, 2010 Response to the Office Action dated Jun. 4, 2010 from the Canadian Intellectual Property Office for Canadian Patent Application No. 2,634,309, 13 pages.

* cited by examiner

*Primary Examiner* — Jermele M Hollington
*Assistant Examiner* — Temilade S Rhodes-Vivour
(74) *Attorney, Agent, or Firm* — Brinks Hofer Gilson & Lione

(57) ABSTRACT

A system and method for monitoring the status of a system of battery strings is described. The system includes a current sensor for each of the battery strings, and a controller configured to compute the average current from the measured currents. The state of the battery system is determined as being fully charged, discharging or charging, and the individual battery string currents are compared with the average measured current to determine if the currents are within a threshold value. An alarm indication is provided when one or more of the currents exceeds a threshold difference. The system may provide a local indication of status and may also interface with a communications network to provide for remote monitoring.

48 Claims, 12 Drawing Sheets

System Name: Main UPS
IP Address: 192.168.254.150

| System Status Summary | |
|---|---|
| String Voltage | 405V |
| Float Current | 0.2 A |
| Charge Current | 00.0 A |
| Discharge Current | 000.0 A |
| Battery Cycles <1min | 0057 |
| Battery Cycles 1< 5 min | 0033 |
| Battery Cycles 5<15 min | 0028 |
| Battery Cycles >15 min | 0010 |
| Total Battery Cycles | 00128 |
| Last Cycle Date | 1-15-06 |
| Last Cycle Time | 15:45 |
| Last Cycle Duration | 20 Min |
| String 1 Temperature | 28°C |

Alarm Status Summary

○ High Float Voltage
○ Low Float Voltage
○ Float Current
○ Float Current % Alarm
○ Charge Current
○ Charge Current % Alarm
○ Discharge Current
○ Discharge Current % Alarm
◐ Temperature ○ ◐ ●
Normal Warning Critical

Menu

System Status
String Details
Event Log
System Settings
System Information
Change System Settings
Change System Information
Change Password

FIG. 5A

System Name: Main UPS
IP Address: 192.168.254.150

Event Log

Total Events: 2

| # | Description | Time | Date |
|---|---|---|---|
| 1 | String 3 High Charge Current | 11:42 | 11-30-06 |
| 2 | String 3 High Charge Current OK | 20:06 | 12-01-06 |
| 3 | | | |
| 4 | | | |
| 5 | | | |
| 6 | | | |

Menu

System Status
String Details
Event Log
System Settings
System Information
Change System Settings
Change System Information
Change Password

FIG. 5C

System Name: Main UPS
IP Address: 192.168.254.150

| Menu | Settings | | Alarm Threshold Settings | |
|---|---|---|---|---|
| System Status | Nominal String Voltage | 360V | High Float Voltage Alarm | 409V |
| String Details | Max Discharge Current | 300A | Low Float Voltage Alarm | 390V |
| Event Log | Max. Charger Current | 40A | High Temperature Alarm | 35°C |
| System Settings | Number of Strings | 4 | Float Current Alarm | 2A |
| System Information | | | Float Current % Alarm Greater or Less Than | 7% |
| Change System Settings | | | Discharge Current Alarm | 250A |
| Change System Information | | | Discharge Current % Alarm Greater or Less Than | 7% |
| Change Password | | | Charge Current Alarm | 45A |
| | | | Charge Current % Alarm Greater or Less Than | 7% |

FIG. 5D

System Name: Main UPS
IP Address: 192.168.254.150

| Menu | System Information | |
|---|---|---|
| System Status | System Name | Main UPS |
| String Details | System Location | Any City |
| Event Log | System Contact | Will@ <url> |
| System Settings | SMTP Server IP Address | Not Set |
| System Information | Email To Address | Not Set |
| Change System Settings | Email From Address | Not Set |
| Change System Information | SNMP Read Community | public |
| Change Password | SNMP Write Community | private |

FIG. 5E

System Name: Main UPS
IP Address: 192.168.254.150

| Menu | Change System Settings | | |
|---|---|---|---|
| | Parameter | Range | Setting |
| System Status | Nominal String Voltage | 48 - 480 V | ☐ |
| String Details | Number of Cells | 24 – 240 | ☐ |
| Event Log | Min Float Voltage per Cell | 1.2 -2.15VPC | ☐ |
| System Settings | Max Float Voltage per Cell | 1.5 -2.28VPC | ☐ |
| System Information | Max. Discharge Current | 1 - 600A | ☐ |
| | Charger Current | 1 – 300A | ☐ |
| Change System Settings | # of Strings | 1 - 8 | ☐ |
| | High Voltage Alarm | = NoC x max VPC | ☐ |
| Change System Information | Low Voltage Alarm | = NoC x min VPC | ☐ |
| | High Temperature Alarm | 30 – 35°C | ☐ |
| Change Password | Float Current Alarm | 1 – 3 A | ☐ |
| | Discharge Current % Alarm | +/- 5 – 10% | ☐ |
| | Charge Current % Alarm | = (Charger Current/ #oS) +/- 5-10% | ☐ |

FIG. 5F

BATTERY SYSTEM AND MANAGEMENT METHOD

This application claims the benefit of priority to U.S. provisional application Ser. No. 60/933,829, filed on Jun. 8, 2007, which is incorporated herein by reference.

TECHNICAL FIELD

This application may have relevance to battery systems and the monitoring of the status of rechargeable batteries as used in power supply systems.

BACKGROUND

Direct current (DC) power is needed for many types of telephone communication equipment, for control equipment used at electric utility substations, for computer data centers, and power plants, and other similar uses. The DC power may be supplied by a DC power source which may be supplied with AC power from an AC power source, such as the local power grid, or a generator and prime mover. Standby batteries are utilized as a backup DC power source when the DC power source either cannot supply all the power required by the components or when the AC power supply or other external power source is not available, as during a power failure at the local electric utility, or in the power distribution system. The period of time where such battery backup is required may be reduced by providing local diesel-electric or turbine-powered electric generators. However, during the time where other backup power sources are unavailable or when switching between alternative prime power sources, standby batteries are needed. Since the occurrence of power outages is normally infrequent, the condition of the batteries during the times when they are not actively providing the backup power may not be known.

A storage battery has an internal impedance, which includes resistive, inductive and capacitive components. When the battery is discharging, only DC is involved and the resistive component of the impedance is of interest as the discharge current produces a voltage drop across the internal resistance of the battery in accordance with Ohm's law. Over the life of the battery the internal resistance will increase, at a rate determined by such factors as how many times the battery undergoes cycles of discharging and recharging, and other factors. The internal resistance of any cell will eventually increase to a value where the voltage drop across the effective internal resistance during discharge is so great that the battery can no longer deliver power at its rated capacity. Other defects in the battery, or aging of the battery, may also result in degradation of the capacity of a battery to perform its function.

When strings of batteries are used to increase the voltage being supplied or, in general, when batteries are connected in either series or parallel, the impedance of the overall string has an influence on the amount of energy that can be supplied. Other components of the physical assembly, including connecting links, terminal connections and the like which can exhibit resistance, and whose characteristics may vary with time, due to such factors as corrosion and changes in contact pressure, also contribute to the resultant battery status.

There are a variety of battery monitoring systems available. Typically these battery monitoring systems are configured so as to monitor each of the individual batteries in a battery string. Other monitors are configured so as to monitor individual battery terminal voltages as a means of identifying defective batteries. Such monitoring systems require a direct connection to each of the batteries in the string for proper functioning. Other battery string monitoring systems may use the time-rate-of-change of current from a battery string during a charging operation to determine the resistance of a battery string, such as in U.S. patent application Ser. No. 11/135,688, filed on May 24, 2005, by the same inventors and having a common assignee, and which is incorporated herein by reference.

SUMMARY

A battery system and system for monitoring the performance of a battery system is described, including a current sensor communicating with a controller, and a status display. The current sensor is disposed so as to measure the battery current in a battery string, and the controller compares the measured battery current with an average of the current measured in a plurality of battery strings, and provides an indication when the measured current deviates from the average current by more than a threshold value.

A method of managing a battery system includes the steps of measuring a current of each of a plurality of battery strings; determining the operating state of the battery system using at least the measured currents; computing an average current of the measured currents of the plurality of battery strings; determining a difference value between the current measured for each of the plurality of battery strings and the average measured current; comparing the difference value with a threshold value; and, providing an alarm notification or display when the difference value exceeds the threshold value for the state of the battery system.

BRIEF DESCRIPTION OF THE DRAWINGS

FIGS. 5A-F illustrate examples of computer screens for monitoring and configuring the battery monitoring system of FIG. 3;

DETAILED DESCRIPTION

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that one skilled in the art may effect such feature, structure, or characteristic in connection with other examples, whether or not explicitly stated herein.

Embodiments of this invention may be implemented in hardware, firmware, software, or any combination thereof, and may include instructions stored on a machine-readable medium, which may be read and executed by one or more processors. In an aspect where a computer or a digital circuit is used, signals may be converted from analog format to a digital representation thereof in an analog-to-digital (A/D) converter, as is known in the art. The choice of location of the A/D conversion will depend on the specific system design.

The instructions for implementing process measurement, data analysis and communications processes may be provided on computer-readable storage media. Computer-readable storage media include various types of volatile and non-volatile storage media. Such storage media may be memories such as a cache, buffer, RAM, FLASH, removable media, hard drive or other computer readable storage media. The functions, acts or tasks illustrated in the figures or described herein may be performed in response to one or more sets of instructions stored in or on computer readable storage media. The functions, acts or tasks are independent of the particular type of instruction set, storage media, processor or processing strategy and may be performed by software, hardware, integrated circuits, firmware, micro code and the like, operating alone or in combination. The instructions may be stored on a removable media device for distribution to, or for reading by, local or remote systems. In other embodiments, the instructions may be stored in a remote location for transfer through a computer network, a local or wide area network or over telephone lines. In yet other embodiments, the instructions are stored within a given computer or system.

To support multiple users at geographically distributed locations, web-based or LAN (local-area-network)-based configurations may be used. Where the term LAN, "web" or "Internet" is used, the intent is to describe an internetworking environment, including at least one of a local area network or a wide area network, where defined transmission protocols are used to facilitate communications between diverse, possibly geographically dispersed, entities. An example of such an environment is the world-wide-web (WWW) and the use of the TCP/IP data packet protocol, or the use of Ethernet or other hardware and software protocols for some of the data paths.

Figure 1:
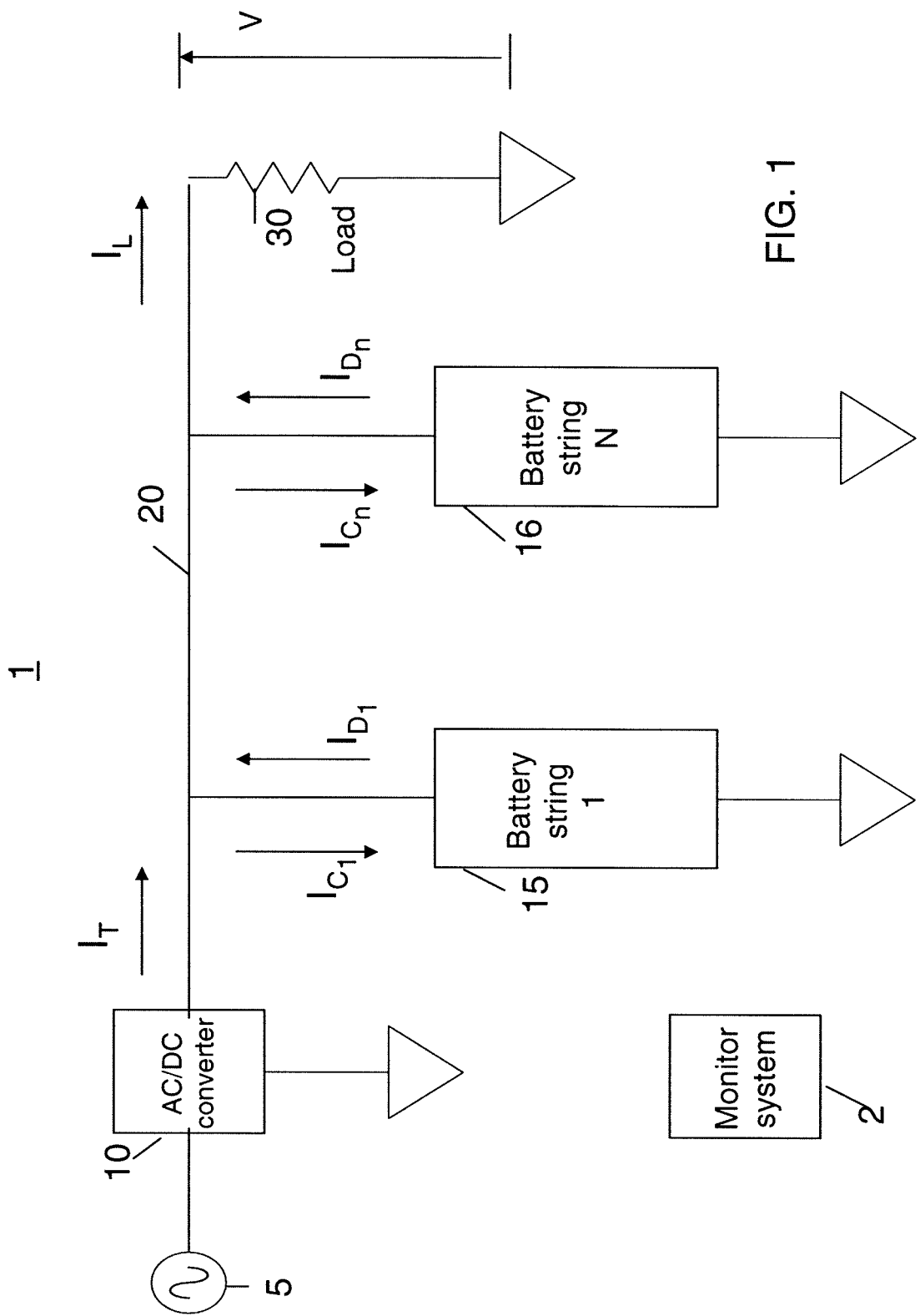
FIG. 1 is a block diagram of a battery backup system.

A battery system may consist of two or more batteries, the batteries configured in a series string, and connected to an electrical load for providing power to the load, and to a charging or recharging device so as to replenish the charge of the batteries when the batteries have been used as a temporary source of power. An example of such a configuration is shown in FIG. 1, where several strings are shown arranged in parallel. The AC/DC converter 10 is connected to a source of electrical power 5, which may be a conventional AC power distribution grid, or a local generator. The input source of power may be switchable between two or more sources (not shown) so that a failure of one source may not interrupt the power supply for an extended period of time. During the time need to switch between alternative power supplies, and which may include the starting time for a motor-generator backup power supply, such as a diesel-electric generator another distribution grid feeder line, or the like, the battery strings 15, 16 provide DC current to the load 30. The term load is understood to mean the power requirements of the equipment using the DC power, and may include computing equipment, telephone switching equipment, or the like. When there is not a source of back-up primary power, the battery strings may have a larger capacity so as to permit a longer period of primary power outage before the stored energy in the batteries is effectively exhausted.

In an example, the batteries may be continuously connected to the load such that, when the DC power supply voltage decreases below the battery string terminal voltage, the batteries supply power, as needed, to the load without interruption. Other configurations are possible, depending on system power continuity requirements.

The voltage V applied to the load 30 depends on the requirements of the specific equipment being powered, and may typically range from about 24 VDC to about 480 VDC, although both higher and lower voltages can be used. A plurality of rechargeable storage batteries may be connected in series to result in the design voltage. Storage batteries, such as lead-acid technology batteries, often are configured to have a terminal voltage of 12.6 VDC, and a plurality of batteries may be connected in series to obtain the design voltage if the voltage is greater than that of a single battery. (Herein, an individual battery terminal voltage of 12 VDC is used in the description as an approximation, for convenience). Thus, a supply voltage of 24 volts DC is provided by connecting in series two battery modules each having a terminal voltage of 12 volts DC. The energy capacity of the storage batteries may be expressed in ampere-hours and is a measure of the time-to-discharge of a battery supplying a known current. Generally, however, storage batteries are not fully discharged in operation.

The current requirements of the load may exceed that which may be supplied by a single string of storage batteries, and thus a first plurality of storage battery strings 15, and additional battery strings 16 each string comprised of a plurality of storage batteries connected in series, are connected in parallel.

The description herein may use lead-acid technology storage batteries as examples; however nothing herein is intended to limit the use of the system and method to any particular battery type.

A first state exists where the primary power is present and the AC/DC converter 10 supplies both the load current $I_L$ and the float current $I_{F1}, \ldots I_{Fn}$ of the individual battery strings $1, \ldots, n$. The load current $I_L$ is the current supplied at a voltage V such that the electrical power requirements of the system defined as the "load" may be satisfied. The "load" may be represented as a nominally resistive element 30 (with respect to the DC aspects of the power requirements), as in FIG. 1. Float currents $I_F$ may be currents flowing into the battery strings 15 16 when the batteries are considered to be in a substantially fully charged state.

When the primary power is not present, a second state occurs where the output current of the AC/DC converter 10 is effectively zero, and the current requirements of the load, $I_L$, are supplied from the battery strings 15, 16. After a discharge period, when the primary power has been restored, in a third state, the AC/DC converter 10 supplies the load current $I_L$ as well as charging currents $I_{C1}, \ldots I_{Cn}$ to the battery strings 15, 16. The charging currents $I_{Cn}$ decrease with time as the storage batteries are recharged, so that, after a period of time, the charging currents $I_{Cn}$ become small, and approach a value of float current $I_{Fn}$.

The quality state of the batteries in a battery string may be determined, as a poor quality or failed battery in a string may prevent the batteries of the battery strings from delivering the expected current to the load during the second (discharging) state, for from achieving the duration of performance expected. A poor quality or defective battery may increase the current required to be delivered by the remaining battery strings, which may exceed the capacity of the remaining strings, and the increased rate of discharge results in a shorter duration of availability of back-up power, a longer charging time, and may adversely affect the lifetime of the batteries.

Each of the batteries in the battery strings may be expected to have substantially the same capacity, internal resistance, operating temperature, and other characteristics, such as terminal voltage and float current. A comparison of the performance of the individual battery strings with respect to each other may provide an indication of the quality state or "health" of the batteries in the battery strings, and permit servicing of the battery backup system 1 prior to an actual failure.

In an aspect, the performance of the batteries in a plurality of battery strings may be evaluated by monitoring the current of each of the battery strings, and comparing the currents measured in each of the operating states using a monitoring system 2. When the batteries in each string are in a satisfactory service condition, currents measured for each of the battery strings may be comparable in each state of the plurality of operating states, considered separately. The battery strings are characterized, for example, by a current $I_D$ in the discharging state, a current $I_C$ in the charging state, and a current $I_F$ in the fully charged (float) state.

Where measured currents are described, including the average of measured currents, the short-term measurement value is meant. That is, the measurement time is short when compared with the rate-of-change of the direct current (DC) portion of the measured current. Some averaging, filtering, or the like, may therefore be used to reduce the effects of noise, or the pick up of alternating currents or ripple.

If the total load current is $I_L$, then, in the second state:

$I_L = \Sigma I_{Di}$, where $i = 1$ 1 to $N$

Similarly, in the first state, $I_L = I_T - \Sigma I_{Fi}$, where $i=1$ to $N$, and $I_T$ is the total output current of the AC/DC converter 10.

In state three, where the batteries are fully charged, the current in each battery string is $I_{Fi}$.

Although $I_{Di}$ and $I_{Ci}$ are used to indicate the current values during the discharging and charging states of strings of batteries in the battery storage system, respectively, and may be measured by the same sensor, the two currents are of opposite sign. In addition, $I_{Fi}$ is the value of $I_{Ci}$ when the battery string is fully charged. The average value, or mean value, of the float current $I_{FA}$ is $\Sigma(I_{F1} \ldots I_{Fn})/N$; the average value of charging current $I_{CA}$ is $\Sigma(I_{C1} \ldots I_{Cn})/N$; and, the average value of the discharging current $I_{DA}$ is $\Sigma(I_{D1} \ldots I_{Dn})/N$. When operating with batteries capable of supplying the required load currents and where the batteries are in a good quality state, the values of the individual battery string measurements for each parameter may be expected to be near the average or mean value of each parameter.

The performance of the battery string may be evaluated by comparing the measured value for each parameter with the mean value of the same parameter obtained by averaging the values for all, or a group of, the battery strings. Upper and lower threshold values may be established, for example as a percentage of the average value, as warning or alarm levels, and these threshold values may differ for the various parameters. The upper and lower threshold limits, in absolute value or as a percentage of the average value of the parameter, may be asymmetrical with respect to the average value.

In an example, for the charging current $I_C$ and the discharging current $I_D$, for example, a ±2.5 percent variation may be established as a warning threshold and a ±5 percent variation established as an alarm level. The normal float current $I_F$ is a small percentage of the battery ampere-hour rating, may differ from battery-technology-to-battery-technology, and may be about 0.001 times the ampere-hour rating for lead-acid storage batteries. Similarly to the current values in the first and second states, a percentage threshold may be established for warning and alarm conditions of the float current $I_F$.

For the discharging current $I_D$ and the charging current $I_C$, measurements may be made during states two and three, respectively, the average values of the computed for each battery string, and the individual battery string currents compared with the established threshold windows. The float state (state 1) may be entered only when the batteries are in a fully charged state and are not discharging.

In an aspect, after a discharge period $T_D$, a time period of about $60\ T_D$ may be established as the time necessary for a battery of the battery string to be again fully charged. That is, one hour of charging time for every minute of discharge time. If multiple failures of the primary power supply occur prior to the occurrence of the fully charged state, the charging time may be extended proportionally to the additional discharge time periods. Once the battery strings are estimated to be in a fully charged state, the current in each of the battery strings is measured, the mean value computed, and the individual values of current compared with the mean and the established threshold windows. The measurements of the float current $I_F$ may be repeated during the time that the battery strings are in a fully charged state.

In another aspect, the amount of energy discharged from the battery during a discharge cycle may be computed by measuring the current during the discharge cycle and a re-charging time estimated based on the discharge time and current and an efficiency factor in recharging.

For example:

Re-charging_time (hrs)=(discharge_time (hrs)×discharge_current)/(K×charging_current), where K is an efficiency estimate for the recharging process, which is approximately 0.85 for many types of lead-acid batteries. Where a second discharging cycle is entered prior to completion of the recharging cycle, the time remaining may be determined by adding the additional recharging time associated with the additional the discharge periods to the remainder of the recharging time.

Thus, in each of the operating states the currents may be monitored to determine that the individual battery string currents have measured values within pre-established limits. The measurement of the float current $I_F$ represents a normal operating state where the primary power is being supplied to the AC/DC power supply, and the batteries are in a fully charged state. In most uses, the fully-charged condition is the predominant operating state.

Figure 2:
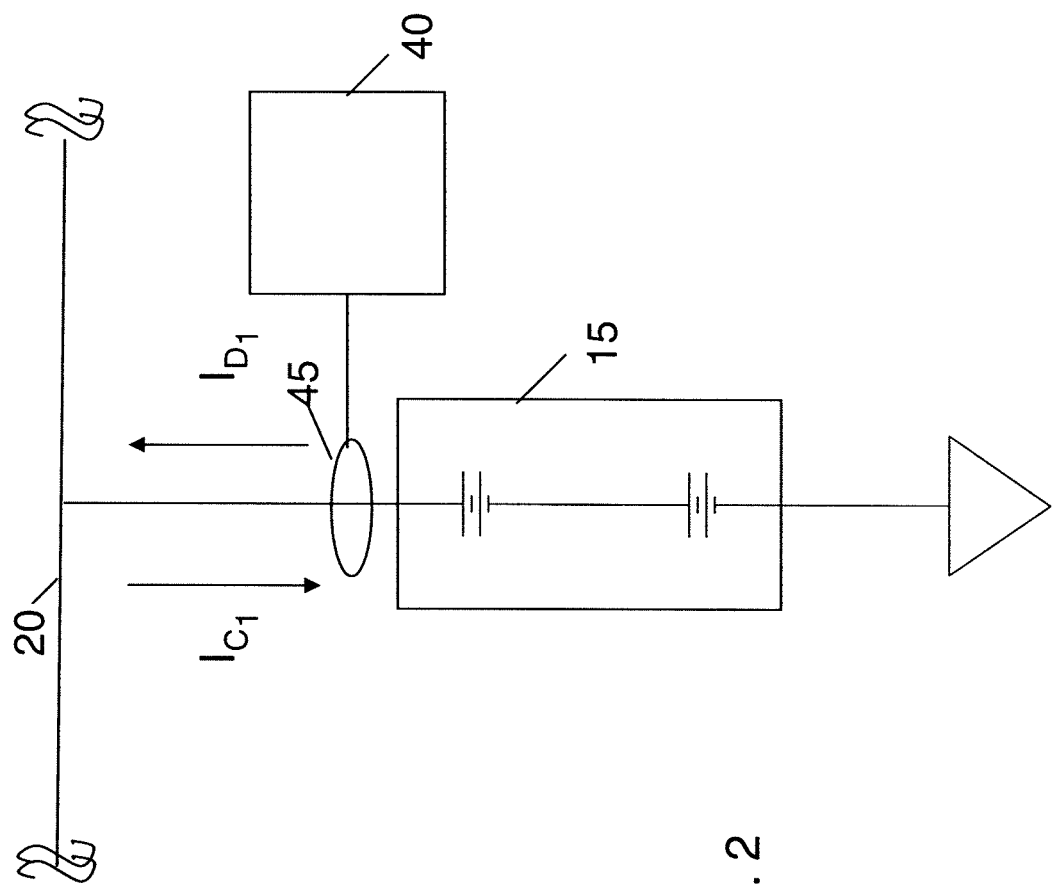
FIG. 2 is a detailed block diagram of a battery string in the arrangement of FIG. 1, showing positions of current sensors.

The current flowing into or out of each battery string 15, 16 may measured by a current sensor, which has the function of an ammeter, and which may be connected at any point in the series connection of the batteries comprising the string. In FIG. 2, a current sensing 2 element 45 of the monitoring system is shown as being placed between the top of the battery string 15 and the bus 20 which connects the battery strings, the ACDC power supply 10 and the load 30. The current sensing element 45 may equally be placed at the ground end of the battery string, or between any of the individual series-connected batteries in an individual string. Any type of current sensor that is effective in measuring direct current may be used. For example, either a Hall effect sensor, or a shunt sensing element inserted in the current path, may be used. Magnetoresistive sensors or other current sensing technologies that may be developed may also be used to perform the function of current sensing.

The current sensing element 45 as shown in FIG. 2 may be considered to represent a magnetic material forming a closed or substantially closed magnetic path about the current carrying wire, and having a Hall-effect current sensor 45 incorporated therein. The Hall-effect sensor may produce a voltage proportional to the current passing through the closed magnetic path, and inducing a magnetic flux in the closed magnetic path. Some sensing elements may have a slight air gap in the closed magnetic path so as to facilitate installing the sensing element on the current-carrying wire. The magnetic flux in the closed magnetic path is substantially the same value, independently of the separation of the loop from the current carrying wire, so long as the current-carrying wire passes through the closed magnetic path.

Current sensors, such as those using the Hall effect, for example, may be operated in an "open-loop or a closed-loop configuration. In an open-loop configuration, an amplified output signal of the Hall-effect sensing element is used directly as the measurement value. The linearity depends on that of the magnetic core, and the scale factor offset and drift, and their temperature dependence, are determined by the Hall-effect sensing element and the amplifier. They are typically less sensitive than closed loop sensors, but are lower in cost. Closed-loop Hall-effect sensors use a feed-back mechanism so as to operate the sensor about a magnetic field value in the magnetic core which is nominally zero. In the closed-loop configuration, the amplified output of the Hall-effect sensing element is applied to a multi-turn coil wound around the magnetic core through which the current-carrying element has been inserted. The value of the current needed to bring the magnetic flux in the core to substantially zero is proportional to the current being measured. The ratio of the feedback current to the measured current is determined by the number of turns in the feedback coil. When operated in the closed-loop mode, the current sensor, the non-linearities and temperature dependence of scale factor in the Hall-effect sensor are avoided. However, the temperature dependence of the offset may need to be compensated.

An example of a suitable closed-loop Hall-effect current sensor is the Honeywell CSNF-151 (available from Honeywell Sensing and Control, Freeport, Ill.). The sensor measures a range of ±150 A, and has a current output, which may be passed through a resistor so as to express the measured value of current as a voltage. Other current sensors, son of which are described herein, are also suitable for use.

Current sensors are available to measure a wide range of current values. Alternatively, a current sensor with a fixed range, such as ±150 A may be used with a current divider, so as to increase the measuring range. For example a 4:1 bus-bar current divider increases the measurement range to ±600 A.

The current measured by the sensing element 45 may be converted to a digital signal representation in an analog-to digital converter (A/D) 40, and interfaced with a microprocessor or other form of digital signal processor. The process of A/D converting may permit the current to be expressed such that the output of the current sensor 45 may be calibrated to account for the use of shunts, the temperature characteristics of the sensor, and the like. All of the currents to be measured may sensed by the one of current sensors 45, and the use of the terminology $I_C$, $I_D$ and $I_F$ is used for convenience in discussion to indicate the state of the system (fully charged-Floating, Discharging, and Charging). Alternatively, a plurality of current sensors 45 may be used where the current ranges and accuracy design considerations make multiple sensors a convenient technique. The currents measured may differ in magnitude and sense, depending of the state of the system. A bit in the A/D converter output may be interpreted to represent the sense of the measured current.

When the system is in state 1 (prime power present-battery fully charged), the current that is sensed the current sensor 45, in the series battery strings 15, 16 is the float current $I_F$; when the system is in state 2 (prime power absent, battery discharging), the current that is sensed is the discharge current $I_D$ and, when the system is in state 3 (batteries being recharged), the current that is sensed is the charging current $I_C$.

In state 1, the sum of the float currents $I_{Fi}$ measured for battery strings 1, ... N is computed, and an average value $I_{FA}$ is obtained. Each of the battery string float currents $I_{Fi}$ is compared with the average value $I_{FA}$ and a percentage variation computed. If the float current $I_{Fi}$ for each of the battery strings is within the predetermined tolerance value, then no action is taken. When the variation of one or more of the battery string currents $I_{Fi}$ exceeds the tolerance or threshold value for a warning or a fault, a warning or fault indication is provided, depending on the deviation of the individual string current $I_{Fi}$ from the average value $I_{FA}$ of the string currents.

In state 2, the string currents measured are discharge currents $I_{Di}$, which are of opposite polarity to the float current $I_{Fi}$, and of much greater magnitude. Similarly to state 1, an average value of the discharge currents $I_{Di}$ may be computed, and the individual discharge currents $I_{Di}$ compared with the average value $I_{DA}$. The total discharge current is the current $I_L$ delivered to the load 30, and may also be measured by a current sensor disposed at the load end of the bus 20 (not shown). Similarly to the float current $I_{Fi}$, the individual values of the string discharge currents $I_{Di}$ may be compared with the average value of the discharge current $I_{DA}$ to determine if the deviation of individual string currents from the average has exceeded one or more thresholds. The warning and alarm thresholds for each of the states may be set to different value, and the positive and negative thresholds for each state may not be the same value.

In state 3, the currents measured are (re-)charging currents $I_{Cn}$. The average value of the charging currents $I_{CA}$ using the individually measured charging currents $I_{Ci}$ is computed at the time of measurement and the individual values of the charging current for each battery string compared with the average value $I_{CA}$ so as to determine the percentage or numerical variation. In a similar manner to that described previously, the percentage or the numerical variations of the individual string currents from the average are compared with the threshold values, and appropriate warnings issued as needed. The total charging current of the battery strings may also be determined as the difference between a current measured by a current sensor placed at the output of the AC/DC power supply 10, and the load current $I_L$, which may be determined by a current sensor at the load.

The sense of current in the battery string measured in state 1 and in state 3 is the same, but the magnitude of the current may differ substantially. In state 1, the batteries are in a fully charged state, and the current $I_{Fi}$ that is needed to keep the batteries in a fully charged state is small compared with the current $I_{Ci}$ that may be needed to charge the batteries, especially during the initial stages of the charging state. The float current $I_F$ is sometimes called the leakage current, or the trickle charge current. The current measured in state 3, begins as a substantial magnitude and diminishes with time as the batteries become more fully charged, so that, after a time, the charging current $I_C$ has decreased to be the float current $I_F$.

Since the float current $I_F$ is small as compared with the other currents that are measured, the accuracy of the current-measuring sensor needs to be considered, so that the variation in the measured values of current for the individual strings is not due to inaccuracies in the current sensors, temperature dependencies or lack of repeatability. For the small current $I_F$ expected during state 1, another, more sensitive, current sensor may be placed in the current path for each of the battery strings. The current sensor for measuring float currents $I_F$ may have a full-scale range somewhat greater than the expected values of the float currents. Since the accuracy of current sensors may be specified as percentage of the full-scale current to be measured, the use of a more sensitive current sensor may increase the accuracy of measurement of the float current $I_F$, and permit closer tolerances to be maintained. However, it may also be possible to use the same current sensor type for all of the measurements.

The system and method described herein may be also used for a single string of batteries. As an average value of the various currents cannot be determined for a single string, a specific current value for the average charging, discharging and float currents may be entered thought the system control interface, and percentage limits established for each of the system states. Alternatively, actual current value limits may be established. In another alternative, the average currents may be determined by testing at initial installation, or after battery replacement, or on the basis of battery specifications and the system design.

Figure 3:
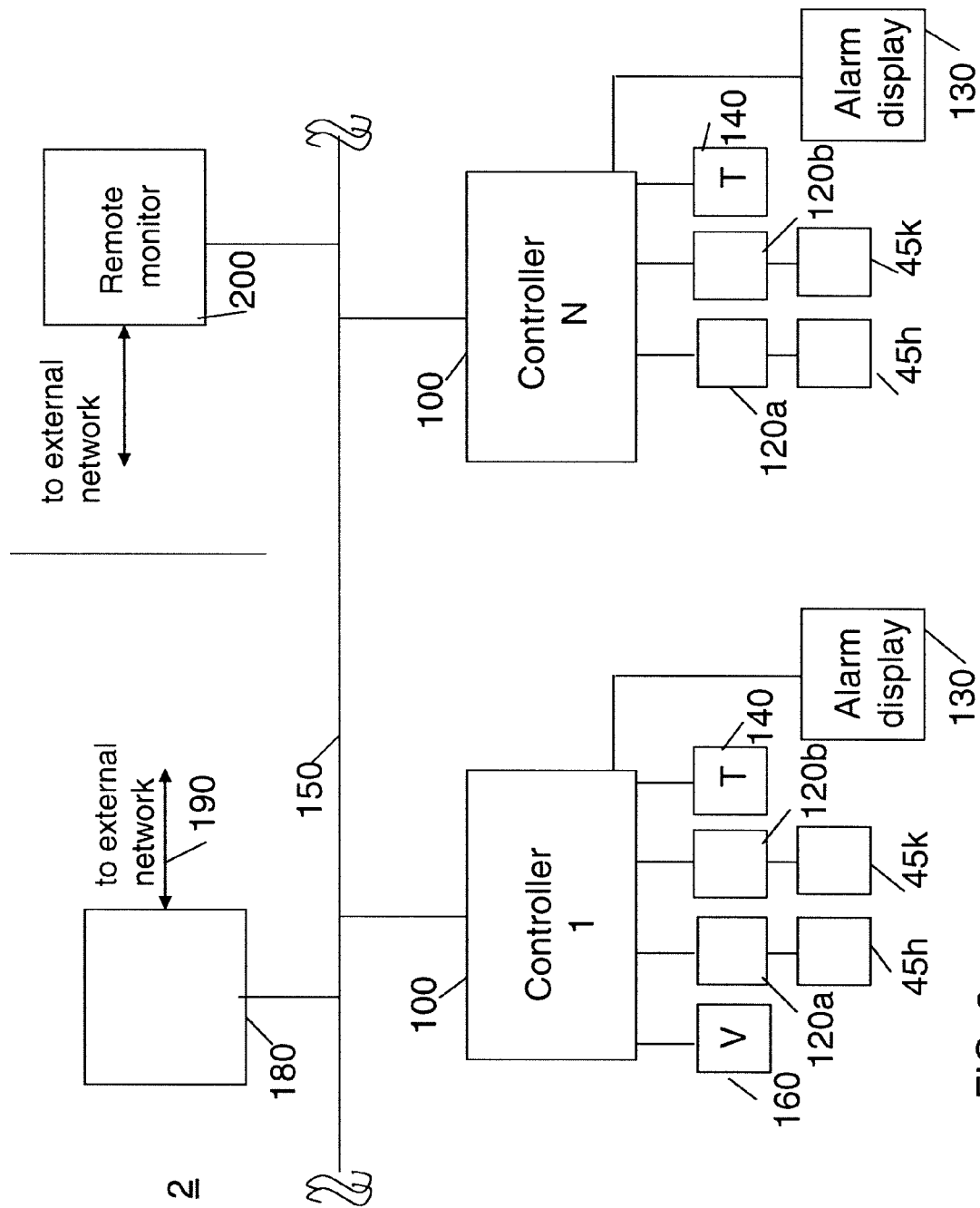
FIG. 3 is a block diagram of a battery monitoring system for use with the battery backup system of FIG. 1.
Figure 4:
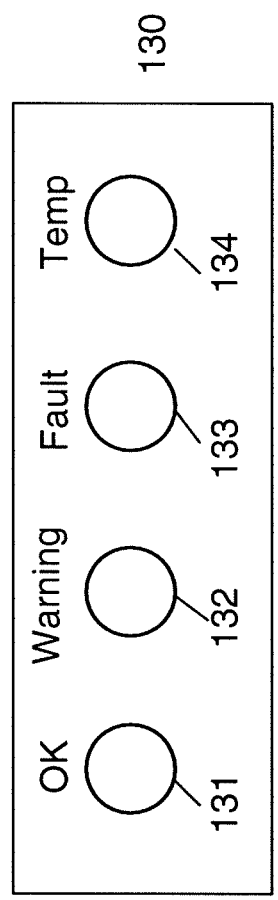
FIG. 4 is a simplified drawing of an indicator panel for displaying status, warnings and alarms in the arrangement of FIG. 3.

FIG. 3 is a system block diagram of an example of the battery monitoring system 2 of the battery backup system 1. In this example, each battery string, or a battery cabinet which may have a plurality of battery strings, may be associated with a controller 100, which may be a microprocessor having an associated memory and interfaces suitable for accommodating the outputs of the current sensors 120, and, optionally, a temperature sensor 140, or a voltage sensor 160. A local status display 130, which may also have a data entry interface may also communicate with the controller 100. The controller 100 may connect to a local area network (LAN) 150, which may connect to a system controller 180.

The system controller 180 may have a configuration that is similar to or the same as the local controller 100, execute suitable software programs, and may include a display and a data entry interface. The system controller 180 may interconnect with other equipment and may do so through a router or by connection to the Internet 190. Communications between the controllers 100 and the system controller 180, and between the system controller 180 and a remotely located monitor 200 may be by the use of any of a variety of communications hardware and format protocols, including Ethernet, the Internet TCP/IP protocol or any versions thereof which may subsequently be developed.

The connections between the various computing devices is shown as being over a wired network, however such communication may be in whole or in part by wireless technology as would be apparent to a person of skill in the art. The data may be encoded as signals and may be modulated on a carrier wave for all or part of the communications path. Such wireless connections may use devices that conform to industry standard protocols such as IEEE 802.11b/g, or other such standards that exist or may be developed to generate and to receive the wireless signals. Similarly, dedicated connections to a network are not needed and may be established as required over various networks which may be provided by others.

Each of the current sensors includes a sensing element 45 and an analog-to-digital converter (A/D) 40, which may include an electrical filter (not shown) to minimize the effect of stray alternating currents, which may include power supply ripple, or noise pick-up. The amount of pick-up of currents related to the frequency of the AC power supply may influence the accuracy of the measurement. Averaging of the data, analog filtering, bucking filtering or digital filtering may be used to reduce the effect of the alternating currents or noise pick-up.

One or more temperature sensors 140 may be associated with each battery string or sensor. The ambient temperature and the losses associated with charging or discharging the battery may affect the battery temperature and the current supply capacity of the battery string and the calibration of the sensors.

A voltage sensor 160, which may perform the function of a voltmeter, may be used on at least one string. The voltage across each battery string is substantially the same, as the strings are connected to a common DC bus so as to connect to the load 30. A difference between battery string voltages may arise due to a resistive voltage drop due to currents in the bus 20. A substantial difference in voltage between the individual battery strings may indicate an increased resistance in the bus, which may also be a fault. Other abnormal conditions may also be sensed, or computed from sensed values. For example, a substantially zero battery string current, when measured in the charging or discharging states, may be indicative of an open circuit in a battery string. Such a condition may also be found in the fully charged condition by a measured string float current substantially outside the tolerance range.

In addition to any display (not shown) associated with the system controller 180 or the remote monitor 200, a local display, which may be illuminated indicators, text, or graphical display may be provided for each string. The display may be of any form suitable for use in indicating the status of the battery string. In an aspect, the display 130 may be a simple indicator display having, for example, indicator lights for Normal 131, Warning 132, Fault 133, and Over Temperature 134 conditions, and mounted so as to be visible to a service technician. Audible alarms (not shown) may also be provided. The alarms 132 and 133 may be combined and only a single type of alarm provided. Other alarm states may also be displayed by indicators, such as open battery string, voltage fault, network connection fault, charging, discharging, and the like. The lights may be off, on (steady) or on (flashing) so as to indicate different states of the system.

In an example, the a high current sensor 45h may be a Hall effect sensor such as a Koshin Electric HC-TFE10VB15H, and a low current sensor 45k may be a Hall effect sensor such as a Allegro MicroSystemsACS755-CB-100 (Worcester, Mass.). The output of the current sensors may be converted to a digital format in an analog-to-digital converter (A/D) such as a Texas Instruments TLC3574 A/D (Dallas, Tex.). The temperature sensor 160 may be an Analog Devices 22100 (Norwood, Mass.). The output of the A/D may be connected to a controller 100 such as a Rabbit Semiconductor RCM3700 (Davis, Calif.), which may also be used as the system controller 180. A personal computer having a processor, display and keyboard and an appropriate communications interface may be used as the remote monitor 200.

The system controller 180 may have a display device and display periodic updates of the various sensor measurements, the number of discharge cycles, the current system state and the like. FIG. 5 is an example of such information being displayed or manipulated by the user in a battery monitoring system 1. FIG. 5A is a summary screen that may be used to visually monitor a battery string or a group of battery strings. In this example, the display may represent the average currents being monitored, and other summary status information. A group of visual indicators may provide alarm information, and may have a indicator showing normal operation. Where an alarm state indicates a warning or fault status, the string number resulting in the warning or alarm may also be displayed. Alternatively, the operator may select a display showing the details of the battery string measurements. In an aspect, the warning or alert may be provided by a voice synthesizer at least one of the controller, the system controller, or a remotely located monitor.

Figure 5B:
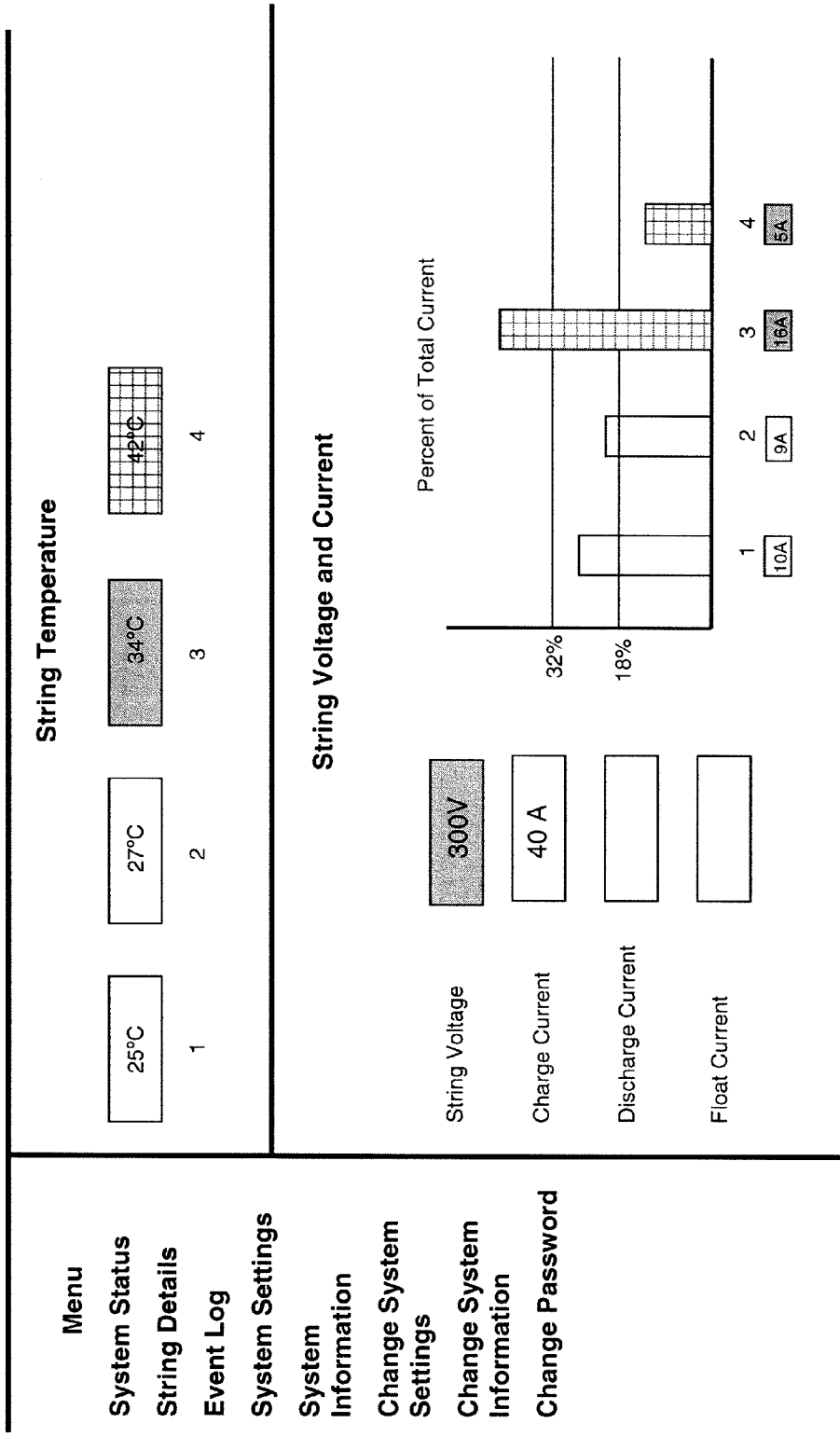

FIG. 5B shows an example of string data details, where the temperature and current for four battery strings is displayed, and operating limits may also be displayed. The display may be graphical, alphanumeric, or both. The operator may then determine the appropriate maintenance action.

FIG. 5C is an example of a cumulative event log display for the system, so that the operator may rapidly review the history of operation of the system. FIG. 5D displays a summary of the system settings, where details characterizing the configuration of the battery string system may be entered so as to permit a variety of system configurations to be accommodated by the hardware and software. Such parameters as the number of individual battery strings, absolute or percentage variation limits, and the like, may be used to establish the system configuration and the boundaries between normal and abnormal operation. Where the system controller is interfaced to a network, additional configuration information may be needed as shown in FIG. 5E. Such information may include the identification of the present system, the Internet address of the server with which the system controller 180 may communicate, and the type of access afforded to messages received over the network.

The measured data may be stored in non-volatile memory in the controller 100, the system controller 180, or the remote monitor 200, as desired so as to provide a historical record of performance. The data may be stored in a time-oriented log, a log of state changes or other events, or the like.

One communications protocol that may be used to manage the battery string system over a network is Simple Network Management Protocol (SNMP). The software running on the system controller 180 and the remote monitor 200 may act as either an agent or a manager so as to exchange information using an Internet protocol, which is presently known as TCP/IP. The functioning of the Internet is described by a series of public documents known as Request for Comment (RFC) as is well known, and will not be further described herein. These aspects will be understood by persons of ordinary skill in the art.

The system settings may be changed, either locally at the controller 100, at the system controller 180, or by the remote monitor 200 using a display screen such as shown in FIG. 5F. In this example, the overall limits of the data values which may be entered are shown, and the entered data may be checked against the limits prior to being accepted. Further, where the combination of data values may also have limits, these may be also checked for validity by the system controller 180.

Figure 6:
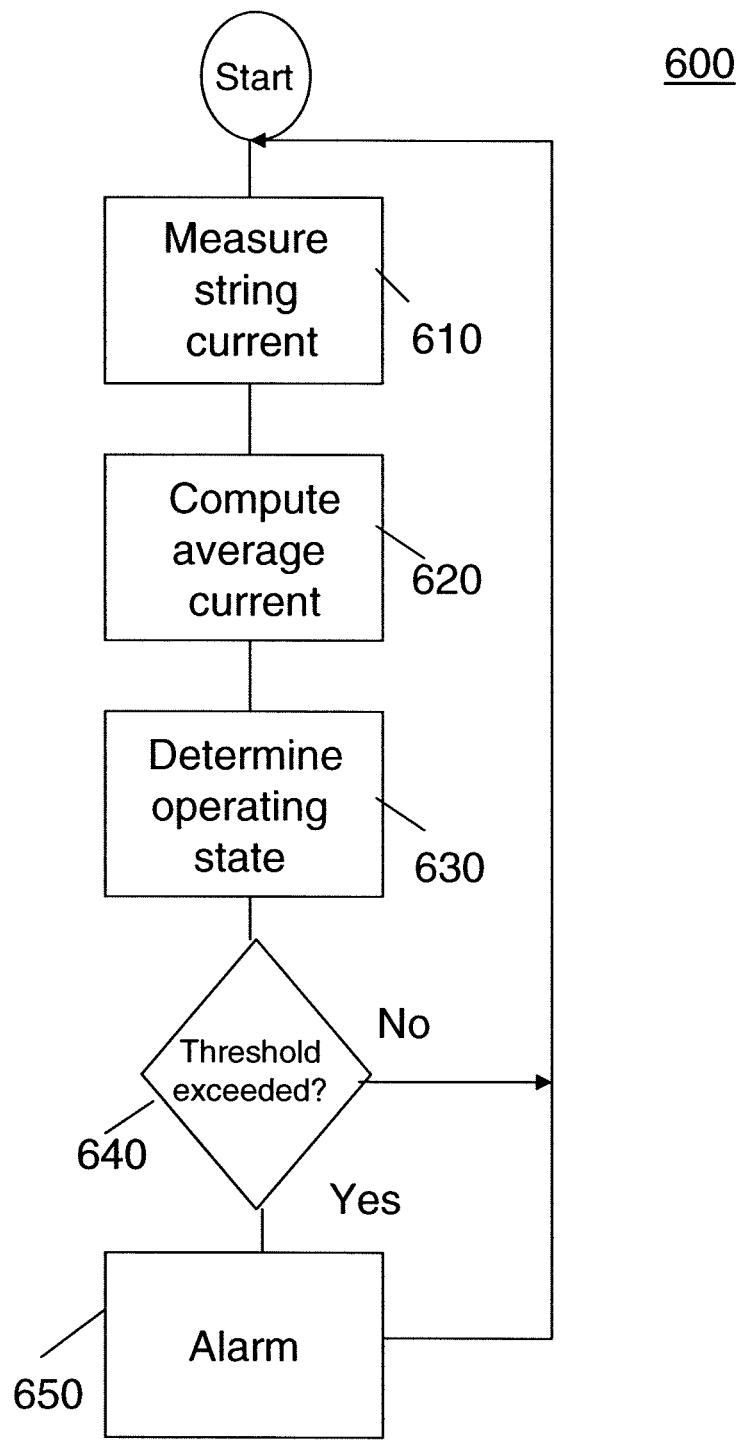
FIG. 6 is a flow diagram showing a method of monitoring the performance and status of a battery backup system.

A method 600 of monitoring the performance of system including a battery string of a plurality of battery strings, shown in FIG. 6, includes: measuring the individual battery string currents (step 610); computing average battery string current of the plurality of battery strings (step 620), and comparing the individual battery string currents with the average battery string current (620), so as to determine the percentage deviation of the battery current from the average battery string current. The state of the battery system as one of fully charged, discharging, or charging is determined (step 630), and the percentage variation from the average current is compared with a threshold in step 640, the threshold being dependent on the battery system state determined in step 630. Warning and alarm thresholds may be established. When the percentage variation determined exceeds one or the warning or the fault threshold, an alarm state is determined (step 650). The alarm may be indicated locally by a local display panel, by a display associated with the system controller, or by being transmitted over a network to a remote monitor. When no alarm condition is determined, the method may be repeated at periodic intervals or when a change in operating state is detected.

Figure 7:
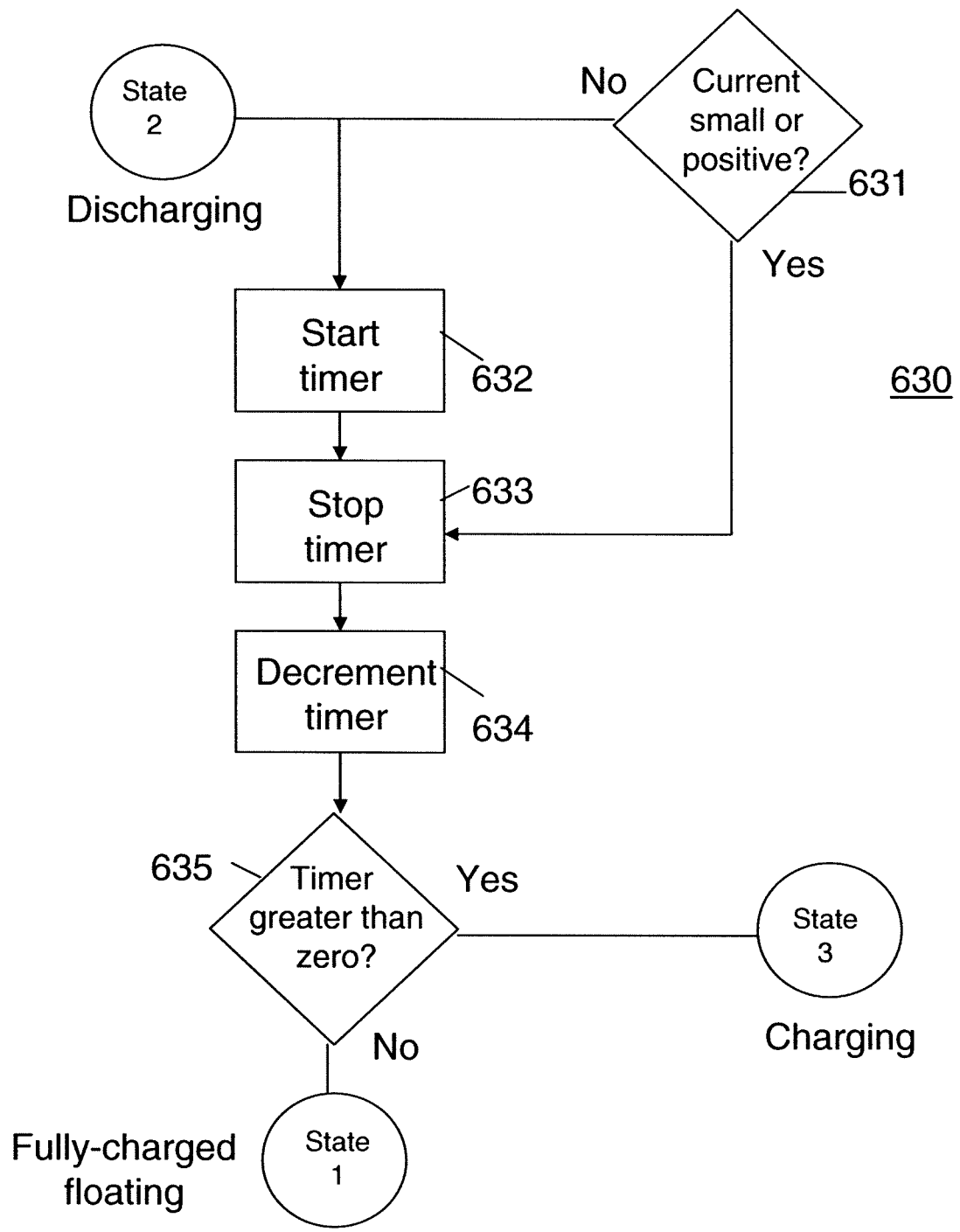
FIG. 7 is a flow diagram showing an example of further details of the flow diagram of FIG. 6.

FIG. 7 illustrates an example of a step the method of FIG. 6, of determining the system state (step 630). The average current determined in step 620 is evaluated to determine whether the current sense is negative and large, or positive. A large positive current is indicative of a charging state (state 3) and the large negative current is indicative of a discharging state (state 2), whereas a small (usually positive) current is indicative of a fully charged state (state 1). The duration of the discharging state (state 2) is measured by a initiating a timer (step 632) when the system is in state 2, and stopping the timer (step 633) when the current changes sign and becomes positive and the batteries are being charged (state 3). When the timer is stopped, the value accumulated in the timer is decremented at a rate characteristic of the ratio of the discharging time to the charging time, and the value is tested (step 635). When the timer is greater than zero, the system may be considered to be in the charging state (state 3), and when the timer reaches zero, the state becomes that of a fully charged battery system (state 1).

The use of the positive sense of current for a charging operation and the negative sense of current for discharging is for convenience only. The transition between a discharging state and a charging state is associated with a change of sign of current where the value of current both prior to and after the transition is large as compared with the float current.

When the system is in state 1 (fully charged), the measured current deviations from the average is computed and, if the threshold limits for the state are exceeded, an alarm provided.

When the system is in state 2 (discharging), the measured current deviations from the average are computed and, if the threshold limits for the state are exceeded, an alarm is provided.

When the system is in state 3 (charging), the measured current deviations from the average are computed and, if the threshold limits for the state are exceeded, an alarm is provided.

While the methods disclosed herein have been described and shown with reference to particular steps performed in a particular order, it will be understood that these steps may be combined, sub-divided, or reordered to from an equivalent method without departing from the teachings of the present invention. Accordingly, unless specifically indicated herein, the order and grouping of steps is not a limitation of the present invention.

In another aspect, a software program product is stored in a computer-readable medium, and the instructions of the product configure a computer to perform the steps in a method of measuring the currents in each of a plurality of battery strings in a battery system, computing the average of the current values and determination the deviation of the current value measured in each string with respect to the average current value. The measured current values are used to determine an operating state of the system. The deviations of the current values are compared with user determined threshold values, and the values may be dependent on the operating state. When the deviation exceeds the threshold, the computer may be configured to actuate an alarm, or to communicate with another computer. Other aspects of the system may be monitored including open circuits, over temperature, change in operating state, and the like, and results of the measurements and data processing may be displayed on a local or remote display, and may be stored as data locally or remotely. The software may embody communication protocols suitable for the Internet.

It is therefore intended that the foregoing detailed description be regarded as illustrative rather than limiting, and that it be understood that it is the following claims, including all equivalents, that are intended to define the spirit and scope of this invention.

What is claimed is:

1. A system for monitoring a battery system connectable to a battery charger, comprising:
   a current sensor disposed so as to measure a direct (DC) current value of a battery string of a plurality of battery strings connected to a DC current source; and
   a controller;
   wherein the controller is configured to compare the measured DC current value of a selected battery string of the plurality of battery strings with an average measured DC current value computed from the measured DC current value of more than one battery string of the plurality of battery strings, and provide an alarm indication when the measured DC current value of the selected battery string deviates from the average measured DC current value by more than a threshold value.

2. The system of claim 1, wherein a state of the battery system when the measured DC current value is compared with the average measured DC current value is determined to be one of a fully-charged state, a discharging state or a charging state.

3. The system of claim 2, where the charging state exists for a time duration after the end of the discharging state, the time duration being proportional to a time duration of the discharging state.

4. The system of claim 2, wherein the measured DC current value in the fully-charged state is a DC float current value.

5. The system of claim 4, wherein a battery string comprises two or more batteries connected in series.

6. The system of claim 1, wherein the threshold value depends on a state of the battery system.

7. The system of claim 6, wherein the threshold value is a percentage of the average DC current for the state of the battery system.

8. The system of claim 6, wherein the threshold comprises at least one of a warning threshold or a fault threshold.

9. The system of claim 1, further comprising at least one of a voltmeter or a temperature sensor.

10. The system of claim 1, wherein the controller communicates with a system controller using a local communications network.

11. The system of claim 10, wherein the local communications network is an Ethernet.

12. The system of claim 10, wherein the local communications network is a wireless network.

13. The system of claim 12, wherein the wireless network conforms to one or more of IEEE 802.11b or IEEE 802.11g.

14. The system of claim 9, wherein at least one of the controller or a system controller is adapted to compute the average measured DC current value of a group of battery strings of the plurality of battery strings, to determine a state of the battery system, and to compare the deviation with the threshold value.

15. The system of claim 9, wherein at least one of the controller or a system controller communicates with a remotely-located controller using a communications network and reports at least an occurrence of the alarm indication.

16. The system of claim 1, wherein the controller is the system controller.

17. The system of claim 1, wherein the alarm indication is displayed by an indicator device.

18. The system of claim 1 wherein the controller communicates with a remotely-located controller using a communications network and reports at least an occurrence of the alarm indication.

19. The system of claim 18, wherein the communications network is the Internet.

20. The system of claim 1, wherein a remotely-located controller receives a report of an alarm indication, and communicates the alarm indication to a user.

21. The system of claim 20, wherein the communication is by a graphical user interface (GUI).

22. The system of claim 20, wherein the communication is by an audible indication.

23. The system of claim 22, wherein the communication is by synthesized speech.

24. The system of claim 1, wherein a battery string of the plurality of battery strings is a plurality of rechargable batteries connected in series, and the plurality of battery strings are connected in parallel to supply electrical power to a load connectable to the system.

25. The system of claim 1, wherein the DC current sensor is a Hall effect device.

26. The system of claim 25, wherein the current sensor is a closed-loop device.

27. The system of claim 25, wherein a bus-bar shunt is used to modify a DC current sensing sensitivity of the current sensor.

28. The system of claim 27, wherein the bus-bar shunt decreases the DC current sensing sensitivity by a factor of 4.

29. A battery system, comprising:
   a plurality of battery strings connected in parallel and configured to be connected to a source of direct (DC) current;
   a DC current sensor disposed in each of at least two battery strings of the plurality of battery strings to measure a DC current value in each of the at least two battery strings of the plurality of battery strings;
   a controller configured to receive at the measured DC current value of for each battery string of the at least two of the plurality of battery strings, and the controller is configured to compute an average measured DC current value of the at least two measured DC current values, and to compare at least one of the received measured DC current values to the computed average measured DC current value.

30. The system of claim 29, wherein a threshold value is established as a variation limit with respect to the average DC current value, and an indication is provided if any of the measured DC currents exceed the threshold value.

31. The system of claim 30, wherein the threshold value is a percentage of the DC average current.

32. The system of claim 30, wherein the threshold value is a numerical value.

33. The system of claim 30, wherein the threshold value comprises an upper threshold value and a lower threshold, and a magnitude of the upper and threshold values are unequal.

34. The system of claim 30, wherein the threshold value is dependent on a system state.

35. The system of claim 34, wherein the system state is one of charging, discharging, or fully charged.

36. The system of claim 34, wherein the discharging state is such that power is being delivered from the battery strings to a load connectable to the battery system.

37. The system of claim 36, wherein the charging state is such that power is being supplied from a source of DC current power to at least the battery strings, and the battery string is not fully charged.

38. The system of claim 29, further comprising an alternating-current-to-direct-current (AC-to-DC) converter, configured to receive power from an external source and provide DC current at least one of the plurality of battery strings or a load.

39. A method of managing a battery system, the method comprising:
   measuring a direct (DC) current of each of a plurality of battery strings
   determining an operating state of the battery system using at least one of the measured DC currents;
   computing an average measured DC current of a group of the measured DC currents of the plurality of battery strings;
   determining a difference value between the measured DC current for a battery string of the plurality of battery strings and the average measured DC current;
   comparing the difference value with a threshold value; and
   providing an alarm indication when the difference value exceeds the threshold value for the determined operating state of the battery system.

40. The method of claim 39, wherein the alarm indication is transmitted over a communications network.

41. The method of claim 39, where the alarm indication is received by a remotely-located controller interfaced with a communications network.

42. The method of claim 39, wherein the threshold value is a percentage of the average DC current for the operating state.

43. The method of claim 39, wherein multiple threshold values exist for at least one state, and a type of the alarm indication depends on the threshold value exceeded.

44. The method of claim 39, wherein the threshold value may have a different value for the measured DC current greater than the average DC current and for the measured DC current less than the DC average current.

45. The method of claim 39, wherein the state of the battery system is determined to be one of fully charged, discharging or charging, based on at least the magnitude or sense of the measured DC current for one or more battery strings.

46. The method of claim 45, wherein when the system is in a discharging state, a subsequent charging state has a time duration which is a multiple of the time duration of the discharging state, and the fully charged state is not determined until the completion of the charging state.

47. The method of claim 46, where the time duration of a plurality of discharging states is cumulative, and the duration of the charging state is a multiple of the cumulative discharging time duration.

48. A software program product, stored in a non-transitory computer-readable medium, enabling a computer to perform the steps in a method, the method comprising:
   measuring a direct (DC) current value in a battery string in a battery system having a plurality of battery strings;
   computing an average value of battery string DC current of using the measured DC current values from at least a group of the plurality of battery strings;
   determining a deviation of the measured DC current value of a selected battery string of the plurality of battery strings from the average value of battery string DC current;
   determining an operating state of the battery system;
   comparing a deviation of the measured DC current value from the average DC current value with a threshold value for the determined operating state; and
   generating an alarm indication when the deviation exceeds the threshold value.

\* \* \* \* \*

UNITED STATES PATENT AND TRADEMARK OFFICE
CERTIFICATE OF CORRECTION

PATENT NO. : 8,558,508 B2
APPLICATION NO. : 12/117462
DATED : October 15, 2013
INVENTOR(S) : William Fechalos et al.

It is certified that error appears in the above-identified patent and that said Letters Patent is hereby corrected as shown below:

<u>In the Specification</u>

In column 1, line 5, after "filed on" replace "Jun. 8," with --June 8,--.

In column 3, line 50, before "to switch" replace "need" with --needed--.

In column 4, line 39, before "when the batteries" replace "15 16" with --15, 16--.

In column 4, line 48, before ". The" replace "15,16" with --15, 16--.

In column 4, line 56, before "from achieving the" delete "for".

In column 5, line 25, replace "where $i$=1 1 to $N$" with --where $i$=1 to $N$--.

In column 6, line 35, after "additional" delete "the".

In column 6, line 46, before "measured by a" insert --be--.

In column 6, line 49, after "current sensing" delete "2".

In column 6, line 52, after "strings, the" replace "ACDC" with --AC/DC--.

In column 7, line 10, after "be operated in" replace "an "open-loop or" with --an open-loop or--.

In column 7, line 38, after "current sensors," replace "son" with --some--.

In column 7, line 53, before "sensed by the one" insert --be--.

In column 7, line 60, before "the state of the system." delete "of".

In column 7, line 64, after "that is sensed" insert --by--.

Signed and Sealed this
Eighth Day of April, 2014

Michelle K. Lee
*Deputy Director of the United States Patent and Trademark Office*

CERTIFICATE OF CORRECTION (continued)
U.S. Pat. No. 8,558,508 B2

In the Specification (cont'd)

In column 7, line 65, after "in the series" insert --of--.

In column 9, line 11, after "be entered" replace "thought" with --through--.

In column 10, line 36, before "a high current" delete "the".

In column 10, line 39, replace "as a Allegro" with --as an Allegro--.

In column 10, line 60, after "and may have" replace "a" with --an--.

In column 10, line 66, before "at least one" insert --in--.

In column 12, line 4, after "example of a step" insert --of--.

In column 12, line 12, after "is measured by" delete "a".

In column 12, line 43, after "reordered to" replace "from" with --form--.

In column 12, line 53, after "and determination" insert --of--.

In the Claims

In column 14, claim 24, line 17, after "a plurality of" replace "rechargable" with --rechargeable--.

In column 14, claim 29, line 40, after "configured to receive" delete "at".

In column 14, claim 29, line 41, before "for each battery" delete "of".

In column 16, claim 48, line 22, after "string DC current" delete "of".